(12) United States Patent
Bonvalot et al.

(10) Patent No.: US 6,433,439 B1
(45) Date of Patent: Aug. 13, 2002

(54) DEVICE WITH SECURITY INTEGRATED CIRCUIT

(75) Inventors: Beatrice Bonvalot, Bures-sur-Yvette; Robert Leydier, Orsay, both of (FR)

(73) Assignee: Schlumberger Systemes, Montrouge (FR)

( * ) Notice: Subject to any disclaimer, the term of this patent is extended or adjusted under 35 U.S.C. 154(b) by 0 days.

(21) Appl. No.: 09/486,527

(22) PCT Filed: Aug. 6, 1998

(86) PCT No.: PCT/FR98/01761

§ 371 (c)(1), (2), (4) Date: Jul. 26, 2000

(87) PCT Pub. No.: WO99/12204

PCT Pub. Date: Mar. 11, 1999

(30) Foreign Application Priority Data

Aug. 28, 1997 (FR) .......................................... 97 10764

(51) Int. Cl.[7] .............................................. H01L 29/40
(52) U.S. Cl. ...................................... 257/777; 257/618
(58) Field of Search ................................ 257/787, 618, 257/777

(56) References Cited

U.S. PATENT DOCUMENTS

| 5,155,068 | A |   | 10/1992 | Tada |
|---|---|---|---|---|
| 5,476,566 | A |   | 12/1995 | Cavasin |
| 5,851,845 | A | * | 12/1998 | Wood et al. ................... 438/15 |
| 5,969,368 | A | * | 10/1999 | Thompson et al. ...... 250/492.3 |

FOREIGN PATENT DOCUMENTS

FR        2727277        5/1995

* cited by examiner

*Primary Examiner*—Roy Potter
(74) *Attorney, Agent, or Firm*—Cohen, Pontani, Lieberman & Pavane

(57) ABSTRACT

A secure integrated circuit device comprising, firstly, an active layer (10) made up of a semiconductor material and of circuits integrated into the semiconductor material and having contact tabs (15) on its active face (11) and, secondly, an additional layer (20). The active layer (10) is bonded to the additional layer (20) by an intermediate layer (30) applied to the surface of the active face (11) of the active layer (10). The face (12) of the active layer (10) opposite from its active face (11) is thinned.

11 Claims, 4 Drawing Sheets

DEVICE WITH SECURITY INTEGRATED CIRCUIT

FIELD OF THE INVENTION

The present invention relates to a secure integrated circuit device comprising, firstly, an active layer made up of a semiconductor material and of circuits integrated into said semiconductor material and having contact tabs on its active face and, secondly, an additional layer. The present invention also relates to a method of manufacturing such a device.

The invention is generally applicable to the field of integrated circuits and, more particularly but in non limiting manner, to the field of portable objects having integrated circuits and of the format of a memory card or cards.

BACKGROUND OF THE INVENTION

As currently made, a memory card commonly comprises a card body made of a plastics material and provided with a cavity in which an electronic module is inserted. The module comprises an integrated circuit and a support for said integrated circuit. When the card operates using contacts, the integrated circuit is connected to regions of the support of the electronic module that are flush with the surface of the card body and, when the card operates without contacts, the integrated circuit is connected to the terminals of an antenna.

Such memory cards are designed for performing various operations such as, for example, payment operations associated with obtaining encrypted television channels, operations associated with the healthcare field, debit operations in public transport vehicles, telephony operations, or banking operations. Such operations are performed in read mode or in read/write mode by means of electrical or electromagnetic coupling between the electronic module of the card and a reader.

In order to avoid or at least limit fraud and/or breaches of civil liberties (e.g., access to personal confidential data stored in the memory card) many different means have been developed. In particular, such means include secret codes, encrypting or authentication keys, or conversion tables. In cards having microcontrollers, such means, as well as the secret information contained in the chip, are essentially contained in Electrically Erasable Programmable Read-Only Memories (EEPROMs) and in Read-Only Memories (ROMs) of the chip, which memories are managed by a Central Processing Unit (CPU).

It is sometimes possible to access secret information contained in the chip by physically analyzing the integrated circuits that it contains.

That is why various techniques have been developed for the purpose of making the integrated circuits secure.

Some of such techniques consist in covering the surface of the integrated circuit, in particular the surfaces of the memory planes of said circuit, with layers of polymer and of metal. The maze-like and entangled nature of the layers makes it difficult to recognize the actual layout of the circuit.

Unfortunately, the degree of security obtained by means of such techniques is not absolute because it sometimes remains possible to access the circuits and the information contained therein by successively and selectively subjecting various layers to chemical etching.

Other techniques propose placing a second, "slave" integrated circuit above a "master" integrated circuit to be protected, and interconnecting said integrated circuits so that if they are separated, then, for example, the secure data is lost irreversibly. Such a device, as described in U.S. Pat. No. 5,877,547, is effective in applications in which said device is always switched on.

SUMMARY OF THE INVENTION

Given the above, an object of the invention is to limit the possibilities of physical access to the integrated circuit of an integrated circuit device at lower cost and more effectively, and without requiring the device to be powered continuously.

This and other objects are attained in accordance with one aspect of the present invention directed to a secure integrated circuit device comprising firstly an active layer made up of a semiconductor material and of circuits integrated into said semiconductor material and having contact tabs on its active face, and secondly an additional layer, active layer is bonded to the additional layer by an intermediate layer applied to the surface of the active face of the active layer, and the face of the active layer opposite from its active face is thinned.

Another aspect of the invention is directed to a method of manufacturing a secure integrated circuit device comprising firstly an active layer made up of a semiconductor material and of circuits integrated into said semiconductor material and having contact tabs on its active face, and secondly an additional layer, active layer is bonded to the additional layer by an intermediate layer applied to the surface of the active face of the active layer, and the face of the active layer opposite from its active face is thinned.

A secure integrated circuit device is thus obtained by making recovery of the active face by physical intrusion critical. In addition, the thickness of the assembly made up of the active layer and of the additional layer, i.e. thickness of the secure integrated circuit device, is about the same as that of a conventional, non-secure integrated circuit device.

BRIEF DESCRIPTION OF THE DRAWINGS

The manner in which the invention may be implemented practically can be better understood from the following non-limiting description given with reference to the accompanying drawings, in which.

DETAILED DESCRIPTION OF THE DRAWINGS

Figure 1:
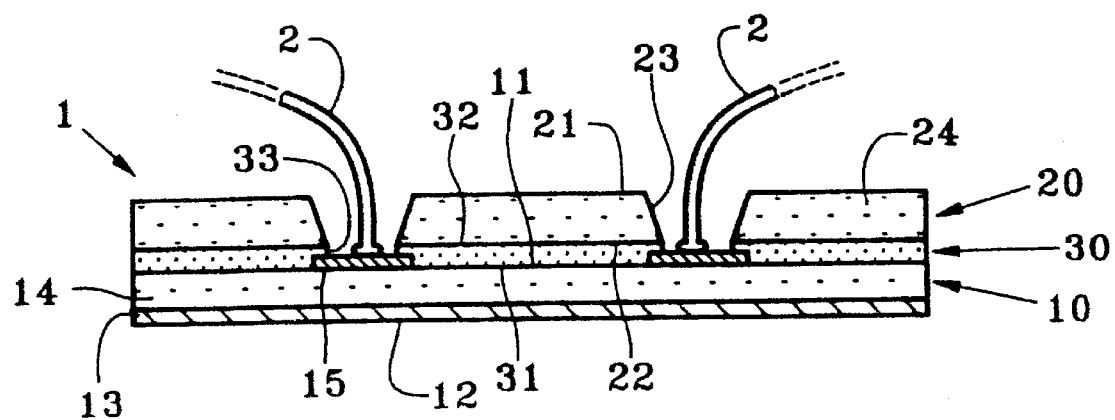
FIG. 1 is a cross-section view of a device of the invention.

As shown in FIG. 1, a secure integrated circuit is device of the invention is made up of two main layers, namely a thinned active layer 10 and an additional layer 20, said layers 10, 20 being bonded together by an intermediate layer 30.

The thinned active layer 10 has an active face 11, and a face 12 opposite from its active face 11. The additional layer 20 has a top face 21 and a bottom face 22.

The layers 10 and 20 are secured together by being bonded together by the layer 30. In the convention used in the drawings, the thinned active layer 10 is placed below the additional layer 20, the active face 11 of the active layer 10 and the bottom face 22 of the additional layer 20 coming into contact respectively with the bottom face 31 of the layer 30 and with the top face 32 thereof.

The thickness of the assembly of superposed layers 10, 20, and 30 is advantageously about the same as the thickness of a conventional, non-secure integrated circuit device as sold in wafers by silicon founders, i.e. about 150 $\mu$m. This assembly can thus be integrated without any difficulty into a module serving for manufacturing memory cards. It can even be integrated "as is" in card bodies using known methods of the Mosaïc (registered trademark) type. Mosaïc was developed by the SOLAIC company and is well known to anyone with ordinary skill in the art. Cards made with the Mosaic process are disclosed in the published PCT application No. WO97/32279.

The thinned active layer 10 has thickness lying in the range 5 $\mu$m to 50 $\mu$m, e.g. about 10 $\mu$m, i.e. thickness that is considerably smaller than the thickness of the active layer of a conventional device of the above-mentioned type, carrying integrated circuits. It is made up of various superposed sub-layers, optionally a sub-layer 13 and an active sub-layer 14.

The sub-layer 13 whose thickness lies in the range 0.1 $\mu$m to 3 $\mu$m, e.g. about 0.4 $\mu$m, is made of an insulating material, in particular silicon dioxide ($SiO_2$), one of whose functions is to limit leakage currents at the sinks constituting the circuits. The sub-layer 13 may however be made of some other material. For example, it made be constituted by a thickness of the silicon substrate which is biased at a potential that is different from the potential of the active sub-layer 14 during thinning. The sub-layer 13 differs from the active sub-layer 14 by at least one physico or chemical characteristic.

The active sub-layer 14 placed immediately above the sub-layer 13 has thickness lying in the range 5 $\mu$m to 50 $\mu$m, e.g. about 10 $\mu$m. It is an epitaxially-grown sub-layer having the electronic circuits integrated therein. This sub-layer 14 is thus conventionally made up of a plurality of interleaved thicknesses, and its surface is subdivided into various zones, in particular ROM and EEPROM zones which store secret information that is to be protected.

Metal input/output contact tabs 15 lie flush with the surface of the active sub-layer 14 or project therefrom.

The bonding layer 30 is made of an insulating material that is chemically highly inert, and in particular that is highly insensitive to conventional solvents. In particular, it may be a layer of polyimide. This layer 30 is provided with openings 33 overlying the tabs 15.

The additional layer 20 has thickness lying in the range 80 $\mu$m to 600 $\mu$m depending on whether or not it has been thinned. It is made of a material that is strong, rigid, and opaque, that is advantageously a semiconductor, and that has the property of being capable of being etched or machined. This semiconductor material is preferably the same as the semiconductor material of the active sub-layer 14 of the active layer 10, i.e. silicon and in particular single-crystal silicon. As a result, it is not possible to distinguish between the layers 10 and 20 by their physico-chemical reactivity. It should be noted that, since the thinned active layer 10 has low thickness, it becomes critical for the materials of the additional layer 20 to have physical characteristics that are identical or very similar to the physical characteristics of the thinned active layer 10. Otherwise, various physical reactions of the layers 10 and 30 might disturb the physical integrity of the device of the invention. For example, a difference in coefficient of thermal expansion between the layers 10 and 30 could give rise to microcracks in the thinned layer 10, thereby making it particularly fragile under the effect of a rise in temperature.

In addition, the layer 20 is provided with vias 23 or any other means serving to enable electrical connection to be established with the tabs 15, and in particular plated through holes. When non-plated vias are used, the electrical connection is established in the device 1 via metal conductor wires 2, e.g. gold or aluminum wires.

Thus, if an attacker were to attempt to access the integrated circuits of a secure device of the invention in order to determine its architecture and in order to extract therefrom any secret information that said device contains, such an attacker would have to try to separate the additional layer 20 from the active layer 10.

For this purpose, an attacker could apply stress forces to the assembly of layers 10 & 20. In which case, the thinned layer 10, being made considerably more fragile, would break in a multitude of places which would make it impossible to determine the architecture of the circuits and to extract the secret information.

An attacker could also attempt to degrade the additional layer 20 and then the bonding layer 30. Given that the bonding agent is advantageously resistant to conventional solvents, then, in order to degrade said layers 20 and 30, such an attacker would have to use strong acids or bases. Such bases destroy silicon, and they would destroy not only the silicon of the additional layer 20 but also the silicon of the active layer 10. Such strong acids would destroy the metal of the tracks forming the integrated circuits. It would thus also be impossible to determine the architecture of the integrated circuits and to extract information therefrom.

The same applies to optical intrusion methods. It should be noted that the additional layer 20 constitutes an effective barrier to ultraviolet (UV) or infrared (IR) radiation, and it therefore prevents any disturbance of the circuits due to UV or IR light.

Figure 4A:
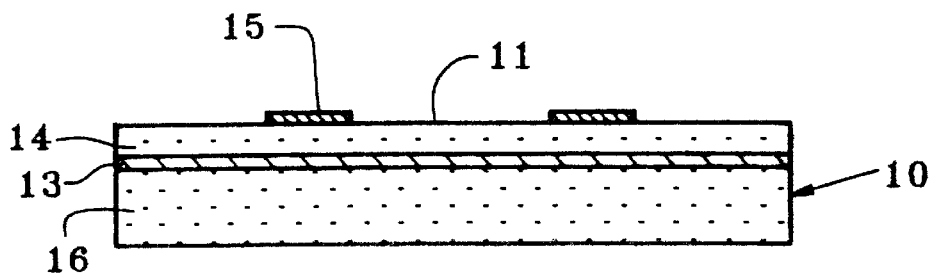
FIGS. 4A to 4C are cross-section views of the various steps for preparing an active layer for a secure integrated circuit device of the invention.
Figure 4B:
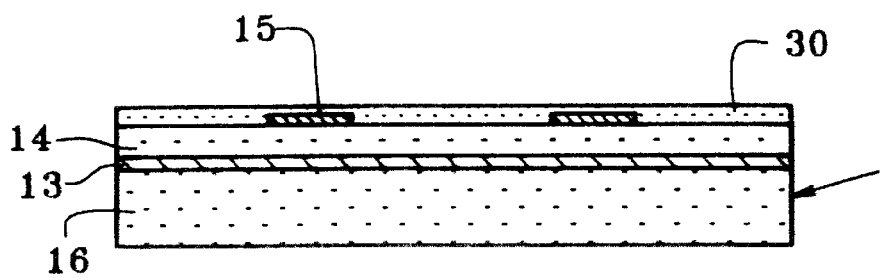
Figure 4C:
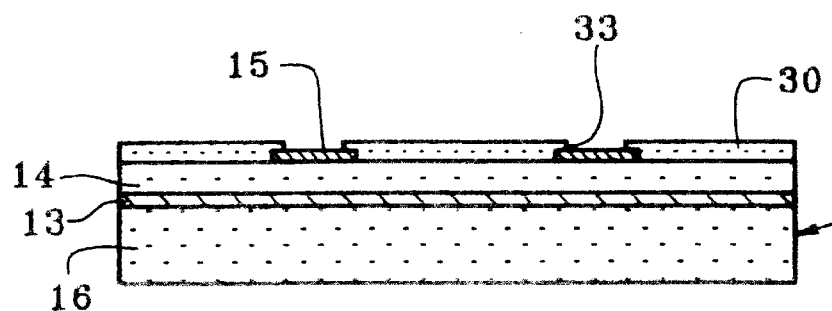

In order to manufacture a device 1 of the invention, the additional layer 20 is formed, the bonding agent is applied to a non-thinned active layer 10 of the type shown in FIG. 4C, the layer 20 is bonded to the layer 10 coated with the bonding agent and, in a subsequent step, the bonded layer 10 is thinned.

Figure 2:
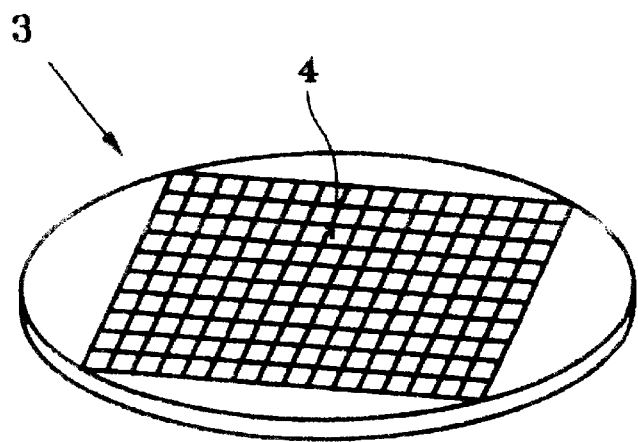
FIG. 2 is a perspective view of an integrated circuit wafer provided with a plurality of devices of the invention.

For reasons of simplicity, the steps involved in manufacturing a secure device of the invention are described mainly with reference to a single device 1, i.e. a chip. In practice, these steps are however advantageously implemented in batches on silicon wafers. For preparing the active layer 10, silicon wafers 3 are used that each have a plurality of integrated circuit devices 4 placed side-by-side (FIG. 2), and, for forming the additional layers 20, silicon wafers are used that are of substantially the same format but that do not have any integrated circuits. By using wafers, a large number of secure integrated circuit devices are obtained rapidly. Thus, this way of implementing the method, which requires no prior modification on the part of founders, constitutes a distinct advantage of the invention.

For forming the additional layer 20, the steps illustrated in FIGS. 3A to 3F are performed.

Figure 3A:
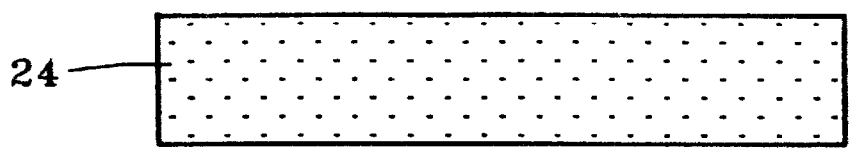
FIGS. 3A to 3F are cross-section views of the various steps for forming an additional layer for a secure integrated circuit device of the invention.
Figure 3B:
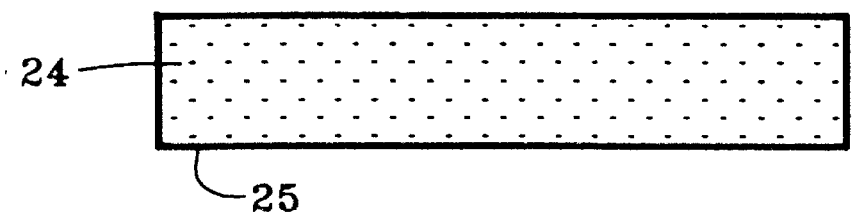

In a first step, a semiconductor substrate 24, in particular a silicon die of thickness of about 400 $\mu$m (FIG. 3A) is subjected to oxidation and optionally to nitriding. At its periphery, the die 24 then shows a layer of oxide 25 and optionally a layer of nitride (FIG. 3B).

Figure 3C:
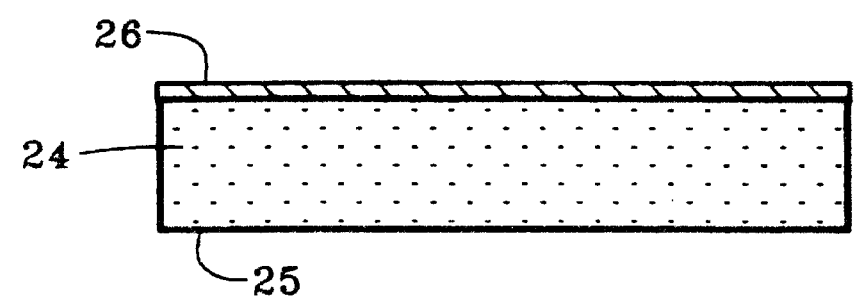

Then, a photosensitive layer 26 is deposited on one of the oxidized faces of the die 24 (FIG. 3C).

Figure 3D:
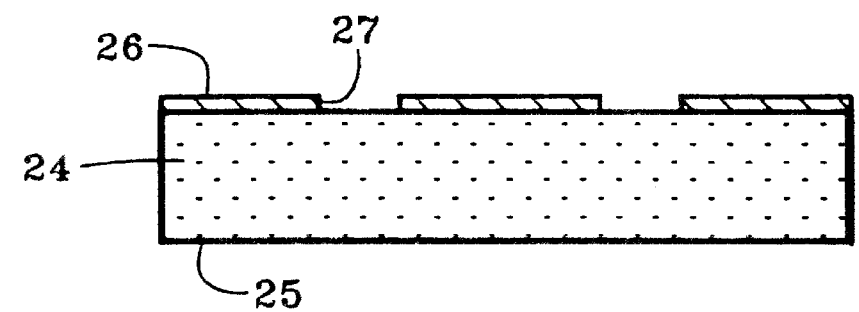

The photosensitive layer 26 is then exposed through a mask, the exposed surface elements of said layer 26 giving way to openings 27 (FIG. 3D).

Figure 3E:
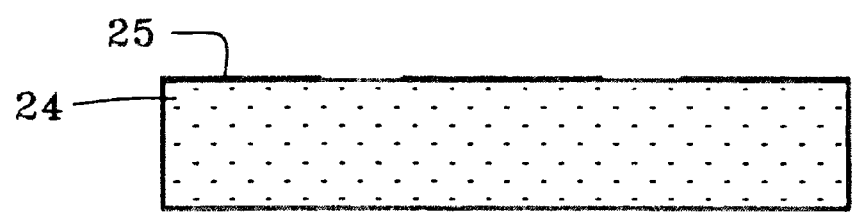

It is then possible to degrade the oxide layer 25 selectively at the locations that are not protected by the photosensitive layer 26, i.e. in particular, the locations of the openings 27 and, optionally on that face of the die 24 which is opposite from the face carrying said openings 27 (FIG. 3E).

In order to obtain the layer 20 (FIG. 3F), the die 24 of FIG. 3E is then machined. This machining is performed by using dry or wet etching techniques. it makes it possible to obtain the vias 23. It also makes it possible simultaneously to thin said die 24 down to a thickness of about 100 μm, or even 80 μm.

In parallel with the above-described steps, the bonding agent is applied to a non-thinned active layer 10.

As shown in FIG. 4A, the non-thinned active layer 10 has a sub-layer 16 of silicon. Given the presence within the non-thinned layer 10 of the $SiO_2$ sub-layer, the assembly of layers 16, 13 & 14 forms a substrate of the Silicon-On-Insulator (SOI) type in which the circuits are installed in a zone that is insulated from the mass of Si by the layer of oxide.

The polymer bonding agent is applied to the surface of the active face 11 of the non-thinned active layer 10 in a viscous form. It then forms the layer 30 that covers the tabs 15 (FIG. 4B).

In the advantageous case when the bonding agent is photosensitive, it is exposed directly through a mask. The openings 33 are thus formed and they clear the way at least in part to the surface of the tabs 15 (FIG. 4C). Otherwise, it is then necessary to apply a photosensitive layer to the surface of the bonding layer 30 and to open said photosensitive layer in the manner described with reference to FIGS. 3C to 3E.

Finally, in the invention, the steps involved in making the device of the invention secure are performed. These steps are illustrated in FIGS. 5A to 5E.

Figure 3F:
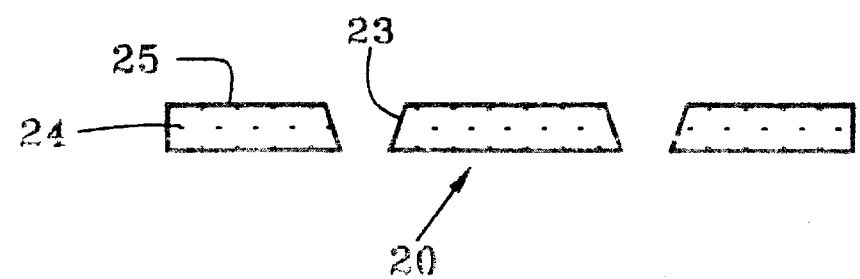

Firstly the additional layer 20 of FIG. 3F is placed on the surface of the assembly of layers 10 & 30 of FIG. 4C so that the vias 23 are positioned overlying the tabs 15.

Then, the layer 20 is bonded to the non-thinned layer 10 by thermo-compression. In practice, the superposed layers 10 and 20 are subjected both to a pressure of about 10 bars and also to a temperature of about 300° C. and lower than the temperature of about 400° C. which corresponds to the limit temperature that can be withstood by the aluminum tracks that form the integrated circuits.

Figure 5A:
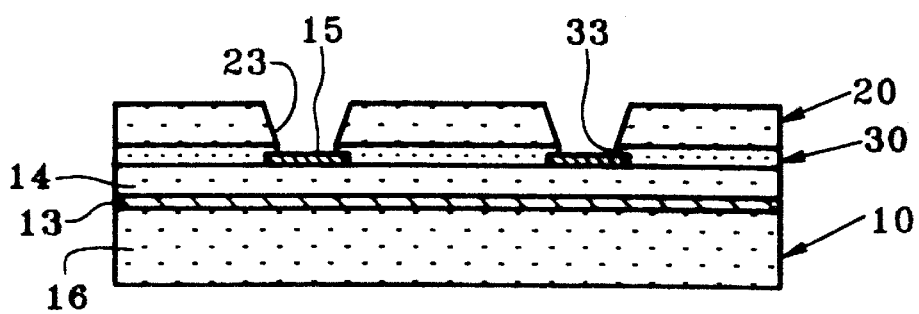
FIGS. 5A to 5D are cross-section views of the various steps for obtaining the secure integrated circuit device of the invention, using the layers formed in the steps shown in FIGS. 3A to 3F and 4A to 4C.
Figure 5B:
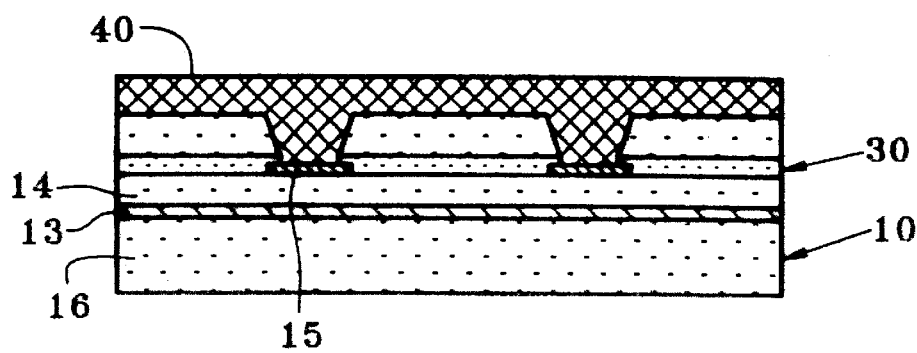
Figure 5C:
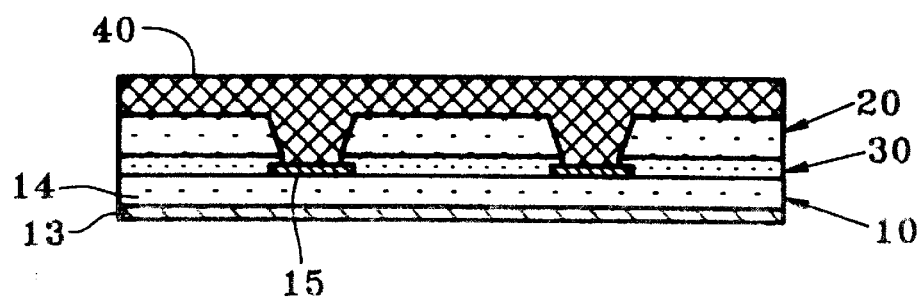

Then, for the purpose of thinning the layer 10, the bonded-together assembly 10, 20 & 30 is protected-by a mechanical protection block 40 that is applied against the top face of said assembly, against the surface of the layer 20 and against the bottoms of the vias 23 (FIG. 5B). It is then entirely possible to machine the rear face of the layer 10 so as to thin the bonded-together assembly down to a thickness of about 150 μm, i.e. to a thickness substantially equal to the thickness of a state-of-the-art conventional non-secure device. Naturally, the thinning is calculated such that the active sub-layer is not subjected to any machining. The presence of the layer 13 also makes it possible to guarantee that the machining is stopped and the thickness of the active zone is controlled accurately, independently of the parallelism characteristics of the two faces of the integrated-circuit wafer.

Figure 5D:
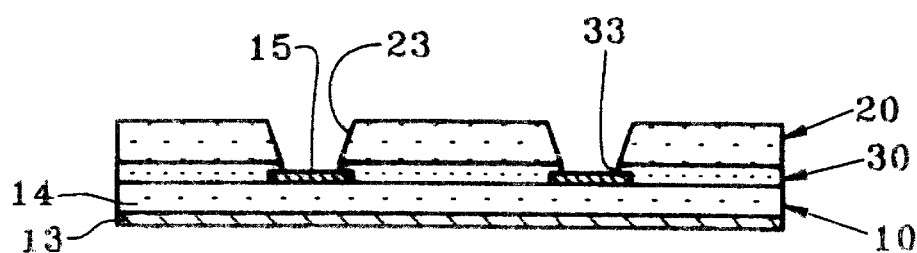

Once the machining has been performed, it is then possible to remove the protection 40 (FIG. 5D).

The wires 2 are then connected to the tabs 15 by means of known conventional methods (wire bonding or wedge bonding in particular).

Naturally, when the method of the invention is implemented on an integrated-circuit wafer, prior to the wire connection bonding steps, the secure devices are cut up from the wafer and, for example, said devices are transferred to a metal-plated strip or "lead frame", and subsequent to said steps, each module is coated with resin before it is mounted in a card body.

What is claimed is:

1. A secure integrated circuit device comprising:

an active layer (10) comprising a semiconductor material, circuits integrated into said semiconductor material, and contact tabs (15) on an active face (11) of the active layer;

an additional layer (20);

wherein the active layer (10) is bonded to the additional layer (20) by an intermediate layer (30) applied to the surface of the active face (11) of the active layer (10); and wherein the additional layer (20) is provided with vias (23) serving to enable electrical connection to be established with said contact tabs (15).

2. A device according to claim 1, characterized in that the thickness of the thinned active layer (10) lies in the range 5 μm to 50 μm.

3. A device according to claim 1, characterized in that the additional layer (20) comprises a semiconductor material.

4. A device according to claim 3, characterized in that the semiconductor material of the additional layer (20) is silicon.

5. A wafer of semiconductor material, characterized in that it is provided with a plurality of devices according to claim 1.

6. A secure integrated circuit device comprising:

an active layer (10) comprising a semiconductor material, circuits integrated into said semiconductor material, and contact tabs (15) on an active face (11) of the active layer;

an additional layer (20);

wherein the active layer (10) is bonded to the additional layer (20) by an intermediate layer (30) applied to the surface of the active face (11) of the active layer (10);

wherein the additional layer (20) is provided with vias (23) serving to enable electrical connection to be established with said contact tabs (15); and wherein on that face (12) of the active layer (10) which is opposite from said active face (11), said active layer has a sub-layer (13) which differs from an active sub-layer (14) by at least one physico-chemical characteristic.

7. A device according to claim 6, characterized in that the sub-layer (13) is a sub-layer of silicon dioxide.

8. A device according to claim 6, characterized in that the thickness of the thinned active layer (10) lies in the range 5 μm to 50 μm.

9. A device according to claim 6, characterized in that the additional layer (20) comprised a semiconductor material.

10. A device according to claim 9, characterized in that the semiconductor material of the additional layer (20) is silicon.

11. A wafer of semiconductor material, characterized in that it is provided with a plurality of devices according to claim 6.

* * * * *